US012538767B2

(12) United States Patent
 Chen et al.

(10) Patent No.: US 12,538,767 B2
(45) Date of Patent: Jan. 27, 2026

(54) PLANARIZATION METHOD

(71) Applicant: UNITED MICROELECTRONICS CORP., Hsin-Chu (TW)

(72) Inventors: Yi-Ching Chen, Kaohsiung (TW); Ching-Ling Lin, Kaohsiung (TW); Wen-An Liang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 326 days.

(21) Appl. No.: 18/513,669

(22) Filed: Nov. 20, 2023

(65) Prior Publication Data
US 2025/0132168 A1     Apr. 24, 2025

(30) Foreign Application Priority Data

Oct. 23, 2023   (TW) .................................. 112140420

(51) Int. Cl.
| | |
|---|---|
| *H01L 21/321* | (2006.01) |
| *H01L 21/3065* | (2006.01) |
| *H01L 21/3105* | (2006.01) |
| *H01L 21/3205* | (2006.01) |

(Continued)

(52) U.S. Cl.
CPC .... *H01L 21/32115* (2013.01); *H01L 21/3065* (2013.01); *H01L 21/31055* (2013.01); *H01L 21/32055* (2013.01); *H01L 21/3212* (2013.01); *H01L 21/32135* (2013.01);
(Continued)

(58) Field of Classification Search
None
See application file for complete search history.

(56) References Cited

U.S. PATENT DOCUMENTS

| | | |
|---|---|---|
| 8,604,562 B2 | 12/2013 | Wang |
| 9,209,033 B2 | 12/2015 | Fernandez |
| 10,332,746 B1 | 6/2019 | Yu |

(Continued)

FOREIGN PATENT DOCUMENTS

TW          I792061 B        2/2023

OTHER PUBLICATIONS

M. Shen et al., "A New Etch Planarization Technology to Correct Non-Uniformity Post Chemical Mechanical Polishing", IEEE Transaction on Semiconductor Manufacturing, vol. 28, pp. 502-507. (Year: 2015).*

*Primary Examiner* — Jiong-Ping Lu
(74) *Attorney, Agent, or Firm* — Winston Hsu (57) ABSTRACT

A planarization method includes the following steps. A silicon layer is deposited on a substrate, and a top surface of the silicon layer includes a lower portion and a bump portion protruding upwards from the lower portion. An ion bombardment etching process is performed to the silicon layer for reducing a surface step height of the silicon layer. The top surface of the silicon layer is etched by the ion bombardment etching process to become a post-etching top surface, and a distance between a topmost portion of the post-etching top surface and a bottommost portion of the post-etching top surface in a vertical direction is less than a distance between a topmost portion of the bump portion and the lower portion in the vertical direction before the ion bombardment etching process. Subsequently, a chemical mechanical polishing process is performed to the post-etching top surface of the silicon layer.

14 Claims, 6 Drawing Sheets

(51) Int. Cl.
    *H01L 21/3213* (2006.01)
    *H10D 30/01* (2025.01)
(52) U.S. Cl.
    CPC .. *H01L 21/32136* (2013.01); *H01L 21/32137* (2013.01); *H10D 30/024* (2025.01)

(56) References Cited

U.S. PATENT DOCUMENTS

| | | | |
|---|---|---|---|
| 11,605,555 B2 | 3/2023 | Chen | |
| 2001/0051435 A1* | 12/2001 | Mearini | H01J 37/3056 257/E21.243 |
| 2011/0312180 A1* | 12/2011 | Wang | H01L 22/12 257/E21.243 |

* cited by examiner

PLANARIZATION METHOD

BACKGROUND OF THE INVENTION

1. Field of the Invention

The present invention relates to a planarization method, and more particularly, to a planarization method including an ion bombardment etching process.

2. Description of the Prior Art

In semiconductor manufacturing processes, a planarization process is a necessary process step for forming circuits, interlayer circuits, and even dielectric layers used to insulate the circuits on the surface of the silicon wafer. In the current semiconductor manufacturing industry, the most common planarization technology is the chemical mechanical polishing (CMP) method, which uses chemical etching and physical polishing to planarize the surface of the target object and make it beneficial to other subsequent processes. Today, CMP has become one of the key processes in the semiconductor manufacturing process. With the changing trends in semiconductor process parameters such as the increase in wafer diameter, shrinking process line width, and increase in device integrity, the industry has stricter requirements for the flatness of wafer surfaces than those in the past. In addition, today's integrated circuit structures further include a variety of different components, making the semiconductor manufacturing process increasingly complicated. There are many challenges in different processes including the CMP process. For example, because of step heights existing between different components and/or different areas and generated by differences in component density and spacing, the existence of the step heights affects the process results of the CMP process and even causes the problem that the surface is still uneven after the CMP process. On the other hand, the subsequent process will be affected by the circuit layout surface which is not completely planarized, the overall manufacturing yield will be lowered, and product characteristics will be affected. Therefore, how to effectively achieve the required planarization effect and relatively simplify the process steps and/or reduce the manufacturing cost is still the direction of continuous efforts in the related fields.

SUMMARY OF THE INVENTION

A planarization method is provided in the present invention. An ion bombardment etching process is performed to a silicon layer before a chemical mechanical polishing process for reducing manufacturing costs and/or simplifying manufacturing processes.

According to an embodiment of the present invention, a planarization method is provided. The planarization method includes the following steps. A silicon layer is deposited on a substrate. A top surface of the silicon layer includes a lower portion and a bump portion protruding upwards from the lower portion. An ion bombardment etching process is performed to the silicon layer for reducing a surface step height of the silicon layer. The top surface of the silicon layer is etched by the ion bombardment etching process to become a post-etching top surface, and a distance between a topmost portion of the post-etching top surface and a bottommost portion of the post-etching top surface in a vertical direction is less than a distance between a topmost portion of the bump portion and the lower portion in the vertical direction before the ion bombardment etching process. Subsequently, a chemical mechanical polishing process is performed to the post-etching top surface of the silicon layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are schematic drawings illustrating a planarization method according to an embodiment of the present invention, wherein

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
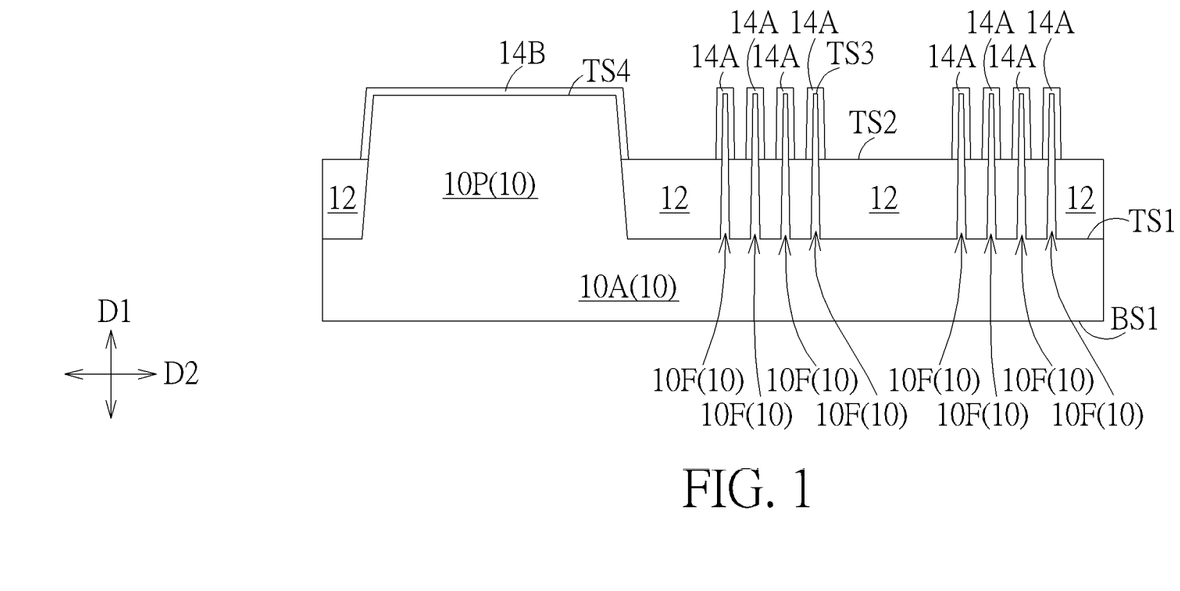
Figure 2:
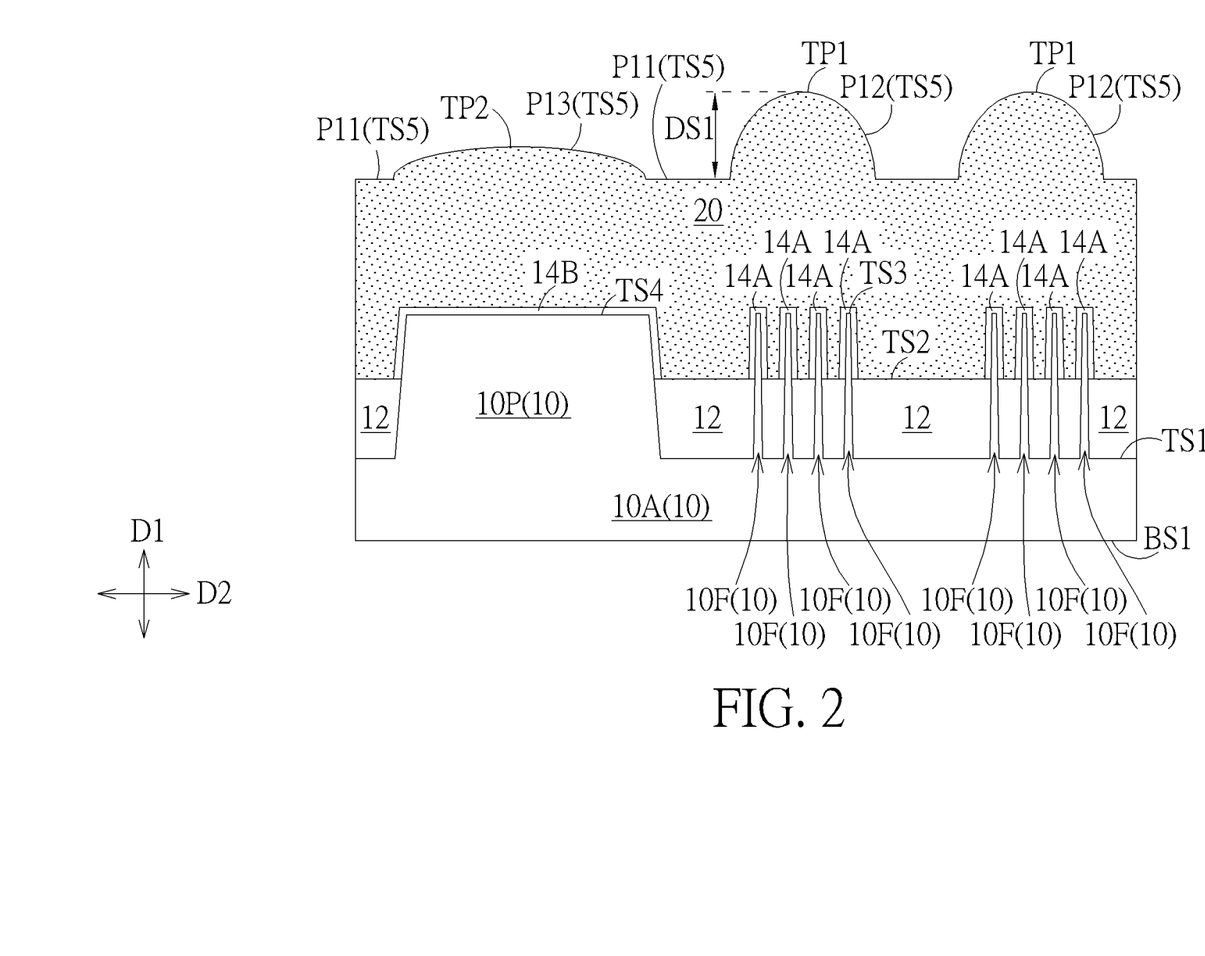
FIG. 2 is a schematic drawing in a step subsequent to FIG. 1.
Figure 3:
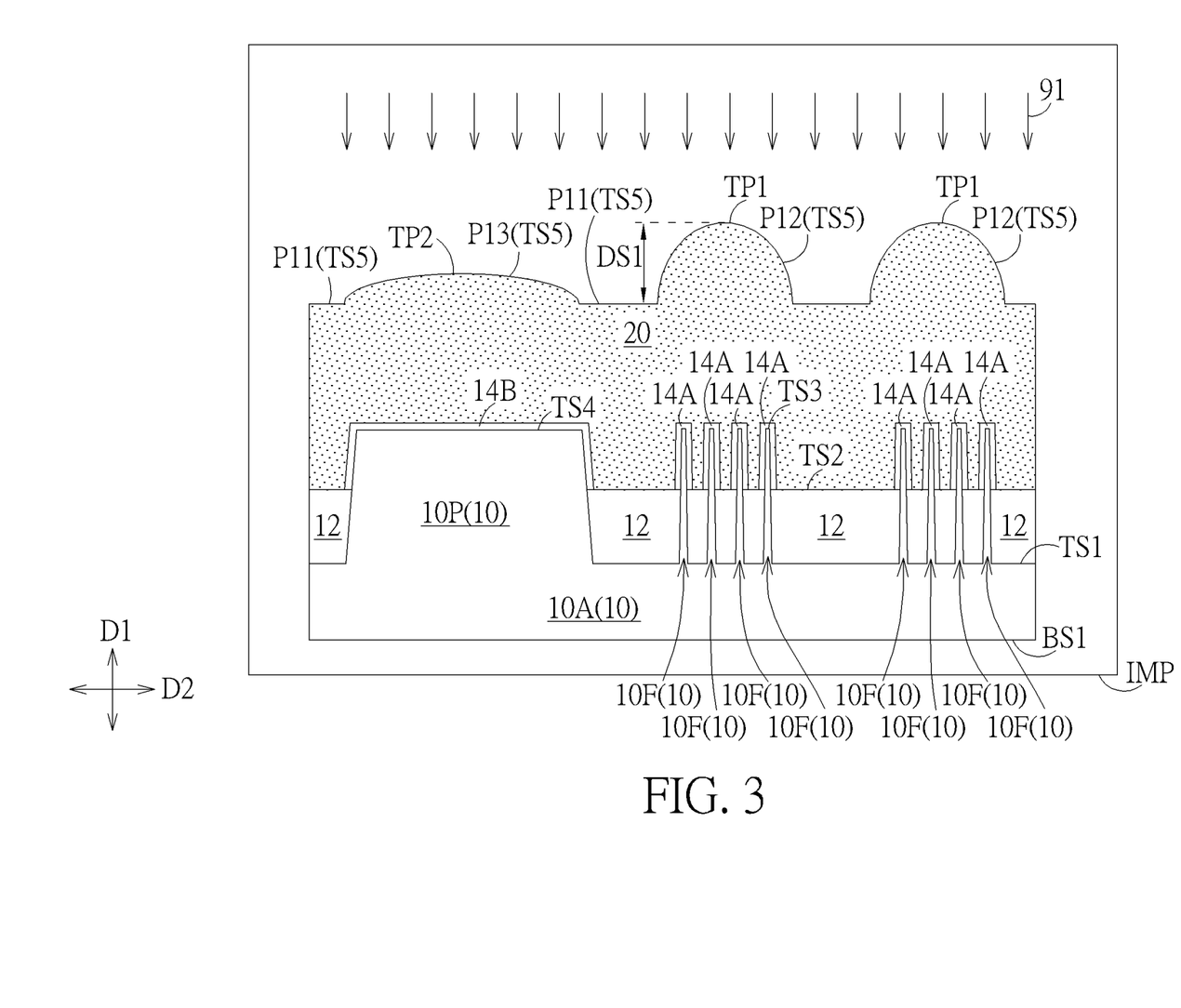
FIG. 3 is a schematic drawing in a step subsequent to FIG. 2.
Figure 4:
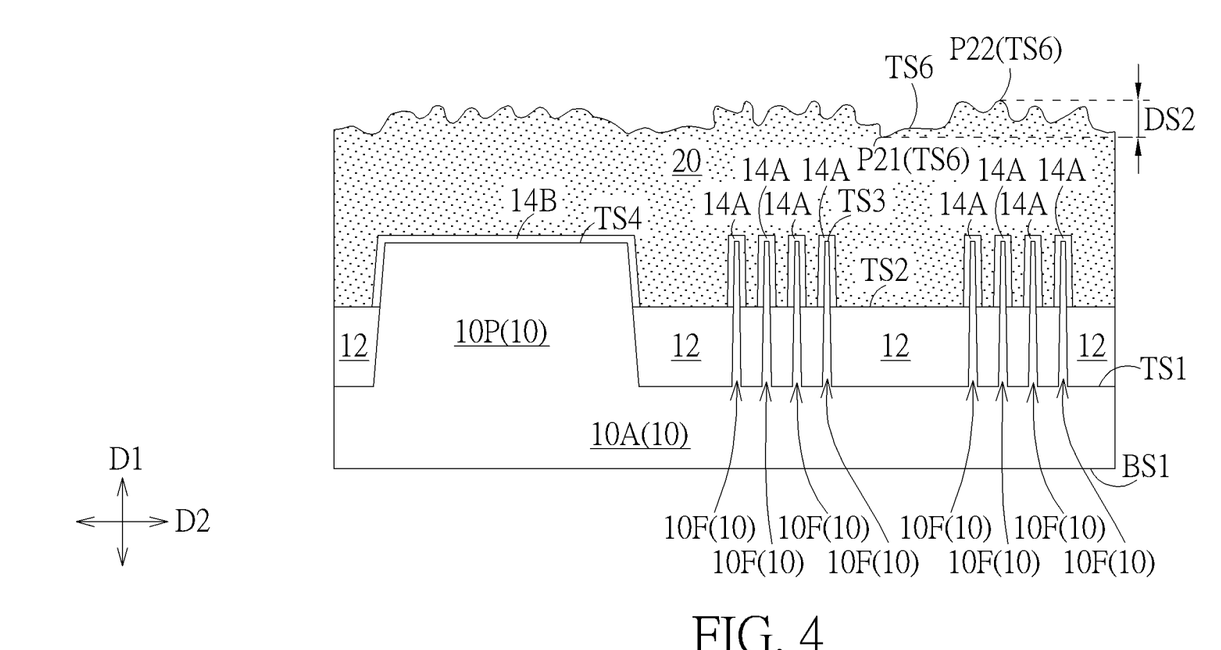
FIG. 4 is a schematic drawing in a step subsequent to FIG. 3.
Figure 5:
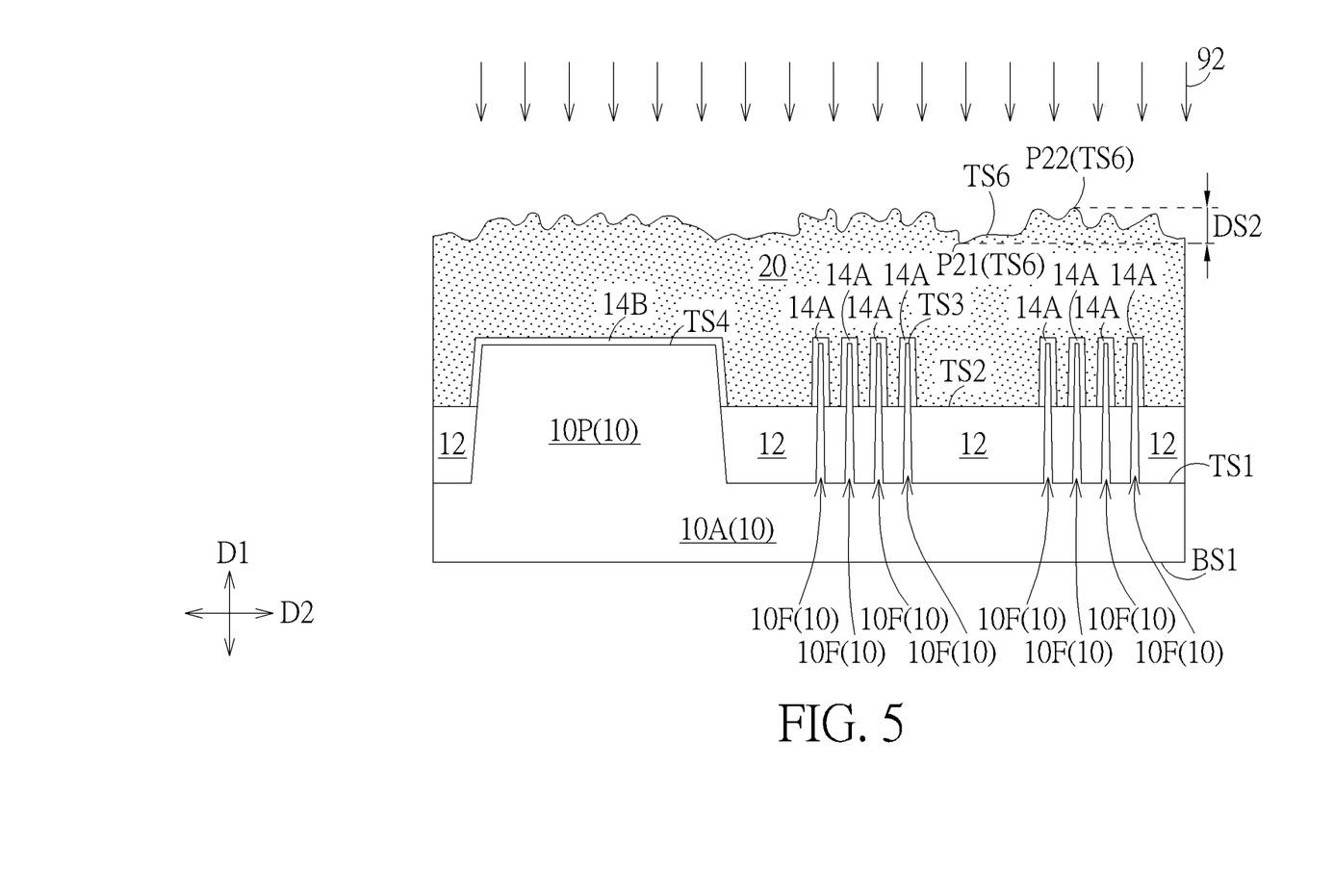
FIG. 5 is a schematic drawing in a step subsequent to FIG. 4.
Figure 6:
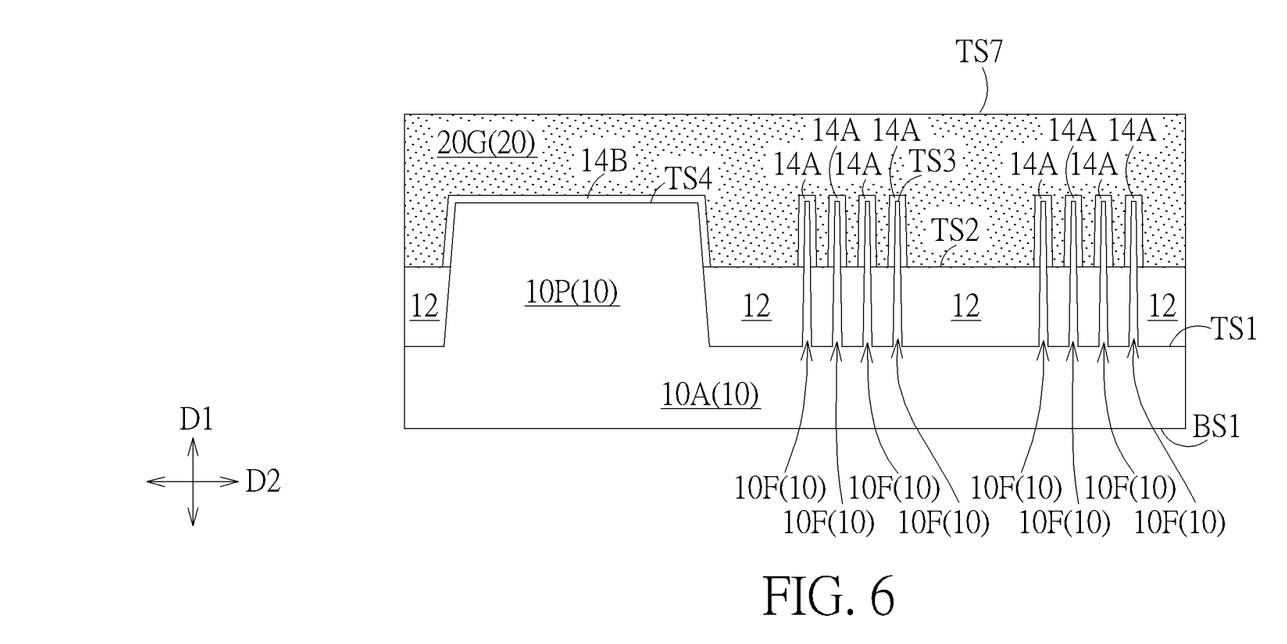
FIG. 6 is a schematic drawing in a step subsequent to FIG. 5.

Please refer to FIGS. 1-6. FIGS. 1-6 are schematic drawings illustrating a planarization method according to an embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5. A planarization method is provided in this embodiment and includes the following steps. As shown in FIG. 1 and FIG. 2, a silicon layer 20 is deposited on a substrate 10. Because of the influence of the surface of the substrate 10 and/or other substances formed on the substrate 10, a top surface of the silicon layer 20 is an uneven surface with obvious surface step height. A top surface TS5 of the silicon layer 20 includes a lower portion P11 and a bump portion P12, and the bump portion P12 protrudes upwards from the lower portion P11. Subsequently, as shown in FIG. 3, an ion bombardment etching process 91 is performed to the silicon layer 20 for reducing a surface step height of the silicon layer 20. As shown in FIG. 3 and FIG. 4, the top surface TS5 of the silicon layer 20 is etched by the ion bombardment etching process 91 to become a post-etching top surface TS6, and a distance DS2 between a topmost portion P22 of the post-etching top surface TS6 and a bottommost portion P21 of the post-etching top surface TS6 in a vertical direction D1 is less than a distance DS1 between a topmost portion TP1 of the bump portion P12 and the lower portion P11 in the vertical direction D1 before the ion bombardment etching process 91. Subsequently, as shown in FIG. 5 and FIG. 6, a chemical mechanical polishing (CMP) process 92 is performed to the post-etching top surface TS6 of the silicon layer 20 for planarizing the surface of the silicon layer 20. In this embodiment, by reducing the surface step height of the silicon layer 20 with the ion bombardment etching process performed before the chemical mechanical polishing process, the loading of the chemical mechanical polishing process may be lowered, the process time of the chemical mechanical polishing process may be reduced relatively, and the planarization performance may be enhanced accordingly.

In other embodiments, for planarizing the silicon layer 20 with the obvious surface step height, other covering materials (such as a silicon nitride layer and an oxide layer) may be deposited on the silicon layer, and a chemical mechanical polishing process may then be performed to the materials. After a part of the silicon layer 20 (such as the bump portion described above) is exposed by the chemical mechanical polishing process, an etching back process may be performed to the silicon layer 20 and the covering materials planarized by the chemical mechanical polishing process for completely removing the covering materials and planarizing the silicon layer 20 to a predetermined thickness. However, the overall process may become complicated by the additionally step of forming the covering materials, and the process cost of the ion bombardment etching process is relatively low (such as being lower than that of the etching back process described above, but not limited thereto). Therefore, the planarization method in the embodiment described above (such as the manufacturing method illustrated in FIGS. 3-6) relatively has the effect of simplifying the manufacturing process and/or reducing the manufacturing cost.

Specifically, the planarization method in this embodiment may include but is not limited to the following steps and/or contents. In some embodiments, the substrate 10 may include a semiconductor substrate, such as a silicon substrate, an epitaxial silicon substrate, a silicon germanium substrate, a silicon carbide substrate, a silicon-on-insulator (SOI) substrate, a substrate made of other suitable semiconductor materials, or a substrate made of other suitable materials. As shown in FIG. 1, in some embodiments, the substrate 10 may include a base layer 10A, a mesa structure 10P, and a plurality of fin-shaped structures 10F. The mesa structure 10P and each of the fin-shaped structures 10F may protrude upwards from a top surface TS1 of the base layer 10A in the vertical direction D1. A material composition of at least a part (such as an upper part) of the base layer 10A may be identical to or similar to a material composition of the mesa structure 10P and/or a material composition of each of the fin-shaped structures 10F. The base layer 10A may be directly connected with the mesa structure 10P and the fin-shaped structures 10F, respectively. For example, the base layer 10A, the mesa structure 10P, and the fin-shaped structures 10F may include the same semiconductor material (such as silicon), and required dopants may be implanted into the mesa structure 10P and/or the fin-shaped structures 10F, respectively, according to some design considerations (such as electrical property modification requirements for corresponding semiconductor devices), but not limited thereto. In other words, the mesa structure 10P and the fin-shaped structures 10F may be structures formed by performing a patterning process to the substrate 10, and a conductivity type and/or a doping condition of the mesa structure 10P may be different from or identical to a conductivity type and/or a doping condition of the fin-shaped structure 10F according to some design considerations. In some embodiments, the fin-shaped structure 10F and the mesa structure 10P may be a semiconductor fin-shaped structure and a semiconductor mesa structure, respectively, and the silicon layer 20 may be a gate material layer located corresponding to the semiconductor fin-shaped structures and/or the semiconductor mesa structure, but not limited thereto.

In some embodiments, the vertical direction D1 described above may be regarded as a thickness direction of the substrate 10 and/or a thickness direction of the base layer 10A. The base layer 10A may have a top surface TS1 and a bottom surface BS1 opposite to the top surface TS1 in the vertical direction D1. Horizontal directions substantially orthogonal to the vertical direction D1 (such as a horizontal direction D2 and other directions orthogonal to the vertical direction D1) may be substantially parallel with the top surface TS1 and/or the bottom surface BS1 of the base layer 10A, but not limited thereto. In this description, a distance between the bottom surface BS1 of the base layer 10A and a relatively higher location and/or a relatively higher part in the vertical direction D1 may be greater than a distance between the bottom surface BS1 of the base layer 10A and a relatively lower location and/or a relatively lower part in the vertical direction D1. The bottom or a lower portion of each component may be closer to the bottom surface BS1 of the base layer 10A in the vertical direction D1 than the top or upper portion of this component. Another component disposed above a specific component may be regarded as being relatively far from the bottom surface BS1 of the base layer 10A in the vertical direction D1, and another component disposed under a specific component may be regarded as being relatively close to the bottom surface BS1 of the base layer 10A in the vertical direction D1. It is worth noting that, in this description, a top surface of a specific component may include the topmost surface of this component in the vertical direction D1, and a bottom surface of a specific component may include the bottommost surface of this component in the vertical direction D1, but not limited thereto.

As shown in FIG. 1 and FIG. 2, in some embodiments, each of the fin-shaped structures 10F may be elongated in a horizontal direction different from the horizontal direction D2 (such as another horizontal direction orthogonal to the horizontal direction D2, but no limited thereto), a length of each of the fin-shaped structures 10F in the horizontal direction D2 may be regarded as a width of each of the fin-shaped structures 10F, and a width of the mesa structure 10P (such as a length of the mesa structure 10P in the horizontal direction D2) may be obviously greater than the width of each of the fin-shaped structures 10F, but not limited thereto. In some embodiments, the mesa structure 10P may become a portion of a planar semiconductor device (such as a transistor, a capacitor, or other suitable semiconductor devices) in the subsequent manufacturing processes, and the fin-shaped structure 10F may become a portion of a fin-shaped semiconductor device (such as a transistor, a capacitor, or other suitable semiconductor devices) in the subsequent manufacturing processes, but not limited thereto. Additionally, in some embodiments, an isolation structure 12 may be formed on the substrate 10 before the silicon layer 20 is formed. The isolation structure 12 may be formed on the top surface TS1 of the base layer 10A and surround the lower portion of each of the fin-shaped structures 10F and the lower portion of the mesa structure 10P in the horizontal directions, and a top surface TS2 of the isolation structure 12 may be lower than a top surface TS3 of each of the fin-shaped structures 10F and a top surface TS4 of the mesa structure 10P in the vertical direction D1. The silicon layer 20 may be formed straddling the fin-shaped structures 10F and the mesa structure 10P, and the silicon layer 20 may contact the top surface TS2 of the isolation structure 12, but not limited thereto. In some embodiments, the isolation structure 12 may include a single layer or multiple layers of insulation materials, such as silicon oxide, silicon nitride, or other suitable insulation materials. Additionally, in some embodiments, a dielectric layer 14A may be formed on each of the fin-shaped structures 10F and a dielectric layer 14B may be formed on the mesa structure 10P after the isolation structure 12 is formed and before the silicon layer 20 is formed. In some embodiments, the dielectric layer 14A and the dielectric layer 14B may respectively include an oxide dielectric material (such as an oxide material formed by an in-situ steam generation approach) or other suitable dielectric materials, and a material composition of the dielectric layer 14A may be identical to or different from a material composition of the dielectric layer 14B according to some design considerations.

As shown in FIG. 2, influenced by the fin-shaped structures 10F and the mesa structure 10P, the top surface TS5 of the silicon layer 20 formed on the substrate 10, the isolation structure 12, the dielectric layer 14A, and the dielectric layer 14B is an uneven surface having an obvious surface step height. For example, in some embodiments, the top surface TS5 of the silicon layer 20 may include the lower portion P11, the bump portion P12, and a bump portion P13. At least a part of the lower portion P11 may be regarded as the bottommost portion of the top surface TS5 in the vertical direction D1, the lower portion P11 may include a relatively flat portion in the top surface TS5, and the bump portion P12 and the bump portion P13 may respectively protrude upwards from the lower portion P11 in the vertical direction D1. In some embodiments, the bump portion P12 may be located above a plurality of the fin-shaped structures 10F (such as the fin-shaped structures 10F disposed adjacent to one another) in the vertical direction D1, the bump portion P13 may be located above the mesa structure 10P in the vertical direction D1, and a height of the bump portion P12 (such as the distance DS1 between the topmost portion TP1 of the bump portion P12 and the lower portion P11 in the vertical direction D1) may be greater than a height of the bump portion P13 (such as a distance between a topmost portion TP2 of the bump portion P13 and the lower portion P11 in the vertical direction D1), but not limited thereto. In other words, the bump portion P12 is formed mainly by the influence of the fin-shaped structures 10F (such as the fin-shaped structures 10F disposed adjacent to one another), the bump portion P13 is formed mainly by the influence of the mesa structure 10P, and the height of the bump portion P13 located corresponding to the mesa structure 10P is less than that of the bump portion P12 because the area of the mesa structure 10P is relatively large, resulting in a relatively small impact on the surface relief of the silicon layer 20, but not limited thereto. In addition, the silicon layer 20 may be an amorphous silicon layer, a polysilicon layer, another semiconductor material layer including silicon, or a non-semiconductor material layer including silicon.

As shown in FIG. 3 and FIG. 4, the ion bombardment etching process 91 may be performed in an ion implantation apparatus IMP or in other suitable apparatuses. In some embodiments, a gas used in the ion bombardment etching process 91 may include germanium, such as a gas of a material containing germanium (such as germanium tetrafluoride ($GeF_4$), but not limited thereto) or other suitable process gas, and the ion bombardment etching process 91 may include a germanium ion bombardment process or other suitable kinds of ion bombardment processes. In some embodiments, when the ion bombardment etching process 91 is performed by the ion implantation apparatus IMP, an ion implantation energy of the ion bombardment etching process 91 may range from 10 keV to 30 keV, an ion implantation dose of the ion bombardment etching process 91 may range from $10^{14}$ ions/cm$^2$ to $10^{16}$ ions/cm$^2$, and the direction and/or the angle of the ion implantation may be adjusted during the ion bombardment etching process 91 for enhancing the ion bombardment to the bump portion P12 and the bump portion P13 and relatively reducing the ion bombardment to the lower portion P11, but not limited thereto. Compared to the normal ion implantation process, the ion implantation energy and/or the ion implantation dose of the ion bombardment etching process 91 is relatively high for generating the required and strong ion bombardment effect. In other words, the required ion bombardment effect cannot be achieved when the ion implantation energy and/or the ion implantation dose is lower than the range described above, and the surface step height of the silicon layer 20 cannot be reduced accordingly. The ion bombardment etching process 91 may generate an etching effect to the silicon layer 20 (such as the top surface TS5 of the silicon layer 20 and the portion adjacent to the top surface TS5 in the silicon layer 20). The top surface of the silicon layer after the ion bombardment etching process 91 may be the post-etching top surface TS6 described above, and the post-etching top surface TS6 is formed by the ion bombardment etching process 91. Additionally, in some embodiments, before the ion bombardment etching process 91, the distance DS1 between the topmost portion TP1 of the bump portion P12 and the lower portion P11 in the vertical direction D1 may be greater than or equal to 200 angstroms and less than or equal to 600 angstroms. After the ion bombardment etching process 91, the distance DS2 between the topmost portion P22 of the post-etching top surface TS6 and the bottommost portion P21 of the post-etching top surface TS6 in the vertical direction D1 may be greater than or equal to 10 angstroms and less than or equal to 60 angstroms. In other words, at least a part of the bump portion P12 and the bump portion P13 may be removed by the ion bombardment etching process 91 for reducing the surface step height of the silicon layer 20, and the post-etching top surface TS6 of the silicon layer 20 is still an uneven surface. Additionally, in some embodiments, the distance DS1 described above may be regarded as a distance between the topmost portion of the top surface TS5 and the bottommost portion of the top surface TS5 in the vertical direction D1, but no limited thereto.

As shown in FIG. 5 and FIG. 6, after the ion bombardment etching process described above, the chemical mechanical polishing process 92 may be performed to the post-etching top surface TS6 of the silicon layer 20 for planarizing the surface of the silicon layer 20. A part of the silicon layer 20 (such as a portion adjacent to the post-etching top surface TS6) may be removed by the chemical mechanical polishing process 92, and the post-etching top surface TS6 may be planarized by the chemical mechanical polishing process 92 for making the silicon layer 20 into a gate material layer 20G, but not limited thereto. Therefore, a surface roughness of a top surface TS7 of the gate material layer 20G may be lower than a surface roughness of the post-etching top surface TS6, and a surface step height of the top surface TS7 of the gate material layer 20G may be smaller than that of the post-etching top surface TS6. In some embodiments, the gate material layer 20G may be used as a gate electrode in a semiconductor device or be used as a sacrificial material layer in a replacement metal gate (RMG) process, but not limited thereto.

To summarize the above descriptions, according to the planarization method in the present invention, the ion bombardment etching process may be performed before the chemical mechanical polishing process for reducing the surface step height of the silicon layer, and the loading of the chemical mechanical polishing process may be lowered accordingly (for example, the process time of the chemical mechanical polishing process may be reduced relatively, but not limited thereto). The planarization effect may be enhanced, the manufacturing cost may be reduced, and/or the overall manufacturing process may be simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A planarization method, comprising:
   depositing a silicon layer on a substrate, wherein a top surface of the silicon layer comprises:
      a lower portion; and
      a bump portion protruding upwards from the lower portion;
   performing an ion bombardment etching process to the silicon layer for reducing a surface step height of the silicon layer, wherein the top surface of the silicon layer is etched by the ion bombardment etching process to become a post-etching top surface, and a distance between a topmost portion of the post-etching top surface and a bottommost portion of the post-etching top surface in a vertical direction is less than a distance between a topmost portion of the bump portion and the lower portion in the vertical direction before the ion bombardment etching process; and
   performing a chemical mechanical polishing process to the post-etching top surface of the silicon layer.

2. The planarization method according to claim 1, wherein the distance between the topmost portion of the bump portion and the lower portion in the vertical direction before the ion bombardment etching process is greater than or equal to 200 angstroms and less than or equal to 600 angstroms.

3. The planarization method according to claim 1, wherein the distance between the topmost portion of the post-etching top surface and the bottommost portion of the post-etching top surface in the vertical direction is greater than or equal to 10 angstroms and less than or equal to 60 angstroms.

4. The planarization method according to claim 1, wherein a gas used in the ion bombardment etching process comprises germanium.

5. The planarization method according to claim 1, wherein the silicon layer is an amorphous silicon layer.

6. The planarization method according to claim 1, wherein the post-etching top surface of the silicon layer is an uneven surface.

7. The planarization method according to claim 1, wherein a part of the silicon layer is removed by the chemical mechanical polishing process, and the post-etching top surface is planarized by the chemical mechanical polishing process.

8. The planarization method according to claim 1, wherein the substrate comprises:
   a base layer; and
   fin-shaped structures, wherein each of the fin-shaped structures protrudes upwards from a top surface of the base layer, and the bump portion is located above the fin-shaped structures in the vertical direction.

9. The planarization method according to claim 8, further comprising:
   forming an isolation structure on the substrate before the silicon layer is formed, wherein a top surface of the isolation structure is lower than a top surface of each of the fin-shaped structures in the vertical direction, the silicon layer is formed straddling the fin-shaped structures, and the silicon layer contacts the top surface of the isolation structure.

10. The planarization method according to claim 9, further comprising:
   forming a dielectric layer on each of the fin-shaped structures after the isolation structure is formed and before the silicon layer is formed, wherein each of the fin-shaped structures is a semiconductor fin-shaped structure, and the silicon layer is a gate material layer.

11. The planarization method according to claim 1, wherein the ion bombardment etching process is performed in an ion implantation apparatus.

12. The planarization method according to claim 11, wherein an ion implantation energy of the ion bombardment etching process ranges from 10 keV to 30 keV.

13. The planarization method according to claim 11, wherein an ion implantation dose of the ion bombardment etching process ranges from $10^{14}$ ions/cm$^2$ to $10^{16}$ ions/cm$^2$.

14. The planarization method according to claim 11, wherein the ion bombardment etching process comprises a germanium ion bombardment process.

\* \* \* \* \*